(12) United States Patent
Seutter et al.

(10) Patent No.: US 11,508,584 B2
(45) Date of Patent: Nov. 22, 2022

(54) DEUTERIUM-CONTAINING FILMS

(71) Applicant: Applied Materials, Inc., Santa Clara, CA (US)

(72) Inventors: Sean M. Seutter, San Jose, CA (US); Mun Kyu Park, San Jose, CA (US); Hien M Le, San Jose, CA (US); Chih-Chiang Chuang, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 344 days.

(21) Appl. No.: 16/900,181

(22) Filed: Jun. 12, 2020

(65) Prior Publication Data

US 2020/0395218 A1    Dec. 17, 2020

Related U.S. Application Data

(60) Provisional application No. 62/862,426, filed on Jun. 17, 2019.

(51) Int. Cl.

| | | |
|---|---|---|
| *H01L 21/30* | (2006.01) | |
| *C23C 16/28* | (2006.01) | |
| *C23C 16/455* | (2006.01) | |
| *H01L 21/768* | (2006.01) | |
| *H01L 21/265* | (2006.01) | |
| *H01L 21/223* | (2006.01) | |

(52) U.S. Cl.
CPC .......... *H01L 21/3003* (2013.01); *C23C 16/28* (2013.01); *C23C 16/45538* (2013.01); *C23C 16/45548* (2013.01); *H01L 21/2236* (2013.01); *H01L 21/265* (2013.01); *H01L 21/76856* (2013.01)

(58) Field of Classification Search
CPC ............. H01L 21/3003; H01L 21/2236; H01L 21/265; H01L 21/76856
See application file for complete search history.

(56) References Cited

U.S. PATENT DOCUMENTS

| | | | |
|---|---|---|---|
| 5,872,387 | A | 2/1999 | Lyding et al. |
| 5,972,765 | A | 10/1999 | Clark et al. |
| 6,023,093 | A | 2/2000 | Gregor et al. |
| 6,025,280 | A | 2/2000 | Brady et al. |

(Continued)

FOREIGN PATENT DOCUMENTS

| | | | |
|---|---|---|---|
| CN | 107591370 A | * | 1/2018 |
| JP | 2002118252 A | | 4/2002 |

(Continued)

OTHER PUBLICATIONS

PCT International Search Report and Written Opinion in PCT/US2020/037849 dated Sep. 25, 2020, 10 pages.

(Continued)

*Primary Examiner* — Eduardo A Rodela
(74) *Attorney, Agent, or Firm* — Servilla Whitney LLC

(57) ABSTRACT

Films are modified to include deuterium in an inductive high density plasma chamber. Chamber hardware designs enable tunability of the deuterium concentration uniformity in the film across a substrate. Manufacturing of solid state electronic devices include integrated process flows to modify a film that is substantially free of hydrogen and deuterium to include deuterium.

17 Claims, 3 Drawing Sheets

(56) References Cited

U.S. PATENT DOCUMENTS

| | | | |
|---|---|---|---|
| 6,077,791 A | 6/2000 | Detar | |
| 6,614,977 B2 | 9/2003 | Johnson et al. | |
| 6,808,748 B2 | 10/2004 | Kapoor et al. | |
| 6,878,575 B2 | 4/2005 | Yoo et al. | |
| 6,891,238 B2 | 5/2005 | Mitani et al. | |
| 6,903,031 B2 | 6/2005 | Karim et al. | |
| 6,943,126 B1 | 9/2005 | Narayanan et al. | |
| 7,056,833 B2 | 6/2006 | Rueger et al. | |
| 7,075,109 B2 * | 7/2006 | Takahara | G02F 1/136227 257/E27.111 |
| 7,087,507 B2 | 8/2006 | Koldiaev et al. | |
| 7,109,103 B2 | 9/2006 | Mitani et al. | |
| 7,273,793 B2 | 9/2007 | Rueger et al. | |
| 8,329,537 B2 | 12/2012 | Kim et al. | |
| 8,450,176 B2 | 5/2013 | Son et al. | |
| 8,669,165 B2 | 3/2014 | Han et al. | |
| 9,853,048 B2 | 12/2017 | Kim et al. | |
| 9,922,879 B2 | 3/2018 | Kim et al. | |
| 2004/0227198 A1 | 11/2004 | Mitani et al. | |
| 2005/0009210 A1 | 1/2005 | Hosotani | |
| 2005/0255684 A1 * | 11/2005 | Koldiaev | H01L 21/3003 257/E21.654 |
| 2007/0148564 A1 | 6/2007 | Iketa et al. | |
| 2013/0284370 A1 | 10/2013 | Collins et al. | |
| 2016/0126118 A1 | 5/2016 | Chen et al. | |
| 2018/0248004 A1 | 8/2018 | Majhi et al. | |

FOREIGN PATENT DOCUMENTS

| | | | | |
|---|---|---|---|---|
| JP | 2005260177 A | * | 9/2005 | ......... H01L 21/2254 |
| WO | 2012078163 A1 | | 6/2012 | |

OTHER PUBLICATIONS

Chen, X., et al., "Isotope effects in amorphous silicon thin films produced by Ar—SiH4-D2 plasma chemical vapor deposition method", Journal of Applied Physics 69, 1678 (1991); https://doi.org/10.1063/1.347212 Submitted: Feb. 12, 1990 . Accepted: Sep. 28, 1990 . Published Online: Jun. 4, 1998.

Han, Seunguk, et al., "In-depth Analysis of NBTI at 2X nm Node DRAM", 978-1-4673-8833.

Jia, Ying, et al., "Effects of Deuterium on Low-Temperature Si Epitaxy by Photo-Chemical Vapor Deposition", Japanese Journal of Applied Physics, vol. 30, No. 5, May 1991, pp. 893-896.

* cited by examiner

DEUTERIUM-CONTAINING FILMS

CROSS-REFERENCE TO RELATED APPLICATIONS

This application claims priority to U.S. Provisional Application No. 62/862,426, filed Jun. 17, 2019, the entire disclosure of which is hereby incorporated by reference herein.

TECHNICAL FIELD

The present disclosure generally relates to electronic devices. More specifically, embodiments of the disclosure are directed to the use of deuterium-containing films to enhance the performance and reliability of electronic devices.

BACKGROUND

Integrated circuits have evolved into complex devices that can include millions of transistors, capacitors, and resistors on a single chip. In the course of integrated circuit evolution, functional density (i.e., the number of interconnected devices per chip area) has generally increased while geometry size (i.e., the smallest component (or line) that can be created using a fabrication process) has decreased.

Reducing the size of integrated circuits (ICs) results in improved performance, increased capacity, and/or reduced cost. Each size reduction requires more sophisticated techniques to form the ICs. Shrinking transistor size, for example, allows for the incorporation of an increased number of memory or logic devices on a chip, lending to the fabrication of products with increased capacity. The drive for ever-more capacity, however, is not without issue. The necessity to optimize the performance of each device becomes increasingly significant.

Semiconductor manufacturers need a process and hardware to enable deposition or modification of a film for more reliable passivation of solid state electronics, e.g. DRAM. Additionally, tunability and in-wafer uniformity control is needed to improve device die yields.

SUMMARY

One or more embodiments of the invention are directed to a method. In one embodiment, a method comprises modifying a substrate with a film deposited thereon, the film substantially free of hydrogen and deuterium to contain deuterium.

In a further embodiment, a method comprises exposing a substrate with a film substantially free of hydrogen and deuterium deposited thereon to a plasma comprising a deuterium-containing precursor to form a modified deuterium-containing film on the substrate.

One or more embodiments are directed to an apparatus. In one embodiment, an apparatus comprises a chamber body comprising a top and at least one side wall defining a plasma cavity; a first gas inlet centrally located in the top of the chamber body, the gas inlet configured to deliver a flow of a plasma comprising a deuterium-containing precursor to the plasma cavity; a second gas inlet located in the at least one side wall of the chamber body, the second gas inlet configure to deliver a flow of the plasma comprising the deuterium-containing precursor to the plasma cavity; a top coil with antennae in the top of the chamber body; at least one side coil in the side of the chamber body; and a multi-zone susceptor, each zone having independent temperature control.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments. The embodiments as described herein are illustrated by way of example and not limitation in the figures of the accompanying drawings in which like references indicate similar elements.

DETAILED DESCRIPTION

Figure 1:
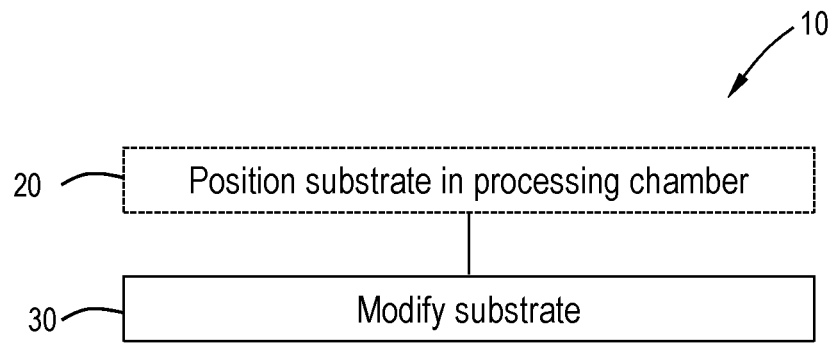
FIG. 1 depicts a flow process diagram of one embodiment of a method of modifying a film according to embodiments described herein.

Before describing several exemplary embodiments of the disclosure, it is to be understood that the disclosure is not limited to the details of construction or process steps set forth in the following description. The disclosure is capable of other embodiments and of being practiced or being carried out in various ways.

The term "about" as used herein means approximately or nearly and in the context of a numerical value or range set forth means a variation of ±15%, or less, of the numerical value. For example, a value differing by ±14%, ±10%, ±5%, ±2%, or ±1%, would satisfy the definition of about.

As used in this specification and the appended claims, the term "substrate" or "wafer" refers to a surface, or portion of a surface, upon which a process acts. It will also be understood by those skilled in the art that reference to a substrate can refer to only a portion of the substrate, unless the context clearly indicates otherwise. Additionally, reference to depositing on a substrate can mean both a bare substrate and a substrate with one or more films or features deposited or formed thereon.

A "substrate" as used herein, refers to any substrate or material surface formed on a substrate upon which film processing is performed during a fabrication process. For example, a substrate surface on which processing can be performed include materials such as silicon, silicon oxide, strained silicon, silicon on insulator (SOI), carbon doped silicon oxides, amorphous silicon, doped silicon, germanium, gallium arsenide, glass, sapphire, and any other materials such as metals, metal nitrides, metal alloys, and other conductive materials, depending on the application. Substrates include, without limitation, glass, metal, or semiconductor wafers. Substrates may be exposed to a pretreatment process to polish, etch, reduce, oxidize, hydroxylate (or otherwise generate or graft target chemical moieties to impart chemical functionality), anneal and/or bake the substrate surface. In addition to processing directly on the surface of the substrate itself, in the present disclosure, any of the film processing steps disclosed may also be performed on an underlayer formed on the substrate as disclosed in more detail below, and the term "substrate surface" is intended to include such underlayer as the context indicates. Thus for example, where a film/layer or partial film/layer has been deposited onto a substrate surface, the exposed surface of the newly deposited film/layer becomes the substrate surface. What a given substrate surface comprises will depend on what materials are to be deposited, as well as the particular chemistry used.

As used in this specification and the appended claims, the terms "precursor", "reactant", "reactive gas" and the like are used interchangeably to refer to any gaseous species that can react with the substrate surface.

In one or more embodiments, deuterium (D) advantageously provides an improved way for stabilizing and increasing the reliability of a film on a substrate. Without intending to be bound by theory, it is thought that films containing deuterium and/or hydrogen enable chemical passivation of unsatisfied valence bonds on immobilized atoms in a solid matrix.

Deuterium advantageously enables a stronger and more stable chemical passivation of many atomic elements, compared to chemical passivation with hydrogen. For example in solid materials and solid interfaces created with common silicon-based solid materials such as crystalline silicon, polycrystalline silicon, amorphous silicon, silicon oxide, silicon nitride, and silicon carbide, deuterium makes stronger chemical bonds to silicon atoms compared to hydrogen chemical bonds to silicon atoms. Compared to hydrogen-passivated silicon materials and interfaces, it has been found that deuterium-passivated silicon materials and interfaces are more electrically stable and reliable with higher applied voltages, with higher applied electric currents, with electromagnetic radiation exposures at shorter wavelengths and higher intensity, and at higher temperatures.

In one or more embodiments, materials and interface reliability improvements with deuterium chemical passivation are possible in other common materials systems, such as, but not limited to, III-V and II-VI semiconductors: gallium arsenide, aluminum arsenide, aluminum-gallium arsenide, gallium nitride, aluminum nitride, aluminum-gallium nitride, zinc-oxide, cadmium oxide, cadmium telluride, cadmium-selenide, magnesium-oxide, as well as oxide and nitride derivatives of III-V and II-VI semiconductors.

In one or more embodiments, a film originally deposited on a substrate surface, which does not contain deuterium or hydrogen, is modified to contain deuterium and/or hydrogen. In one or more embodiments, the modification to form the deuterium-containing film occurs by exposing the film that does not contain hydrogen and deuterium in a plasma with chemical precursors that contain deuterium.

In one or more embodiments, a film is deposited on a substrate surface. In one or more embodiments, the film is substantially free of hydrogen and substantially free of deuterium. As used herein, the term "substantially free" means that there is less than 5%, including less than 4%, less than 3%, less than 2%, less than 1%, and less than 0.5% of hydrogen and deuterium in the film.

In one or more embodiments, the film that is substantially free of hydrogen and deuterium is a film having a thickness in a range of about 0.5 nm to about 1000 nm, including about 0.5 nm to about 800 nm, about 0.5 nm to about 700 nm, about 0.5 nm to about 600 nm, about 0.5 nm to about 500 nm, about 0.5 to about 400 nm, about 0.5 to about 300 nm, and about 0.5 to about 200 nm. In some embodiments, the film has a thickness of less than about 1000 nm, including less than about 900 nm, less than about 800 nm, less than about 700 nm, less than about 600 nm, less than about 500 nm, less than about 400 nm, less than about 300 nm, and less than about 200 nm. In some embodiments, the film has a thickness of about 0.5 nm, about 10 nm, about 15 nm, about 20 nm, about 25 nm, about 30 nm, about 35 nm, about 40 nm, about 45 nm, about 50 nm, about 55 nm, about 60 nm, about 65 nm, about 70 nm, about 75 nm, about 80 nm, about 85 nm, about 90 nm, about 95 nm, about 100 nm, about 150 nm, about 200 nm, about 250 nm, about 300 nm, about 350 nm, about 400 nm, about 450 nm, about 500 nm, about 550 nm, about 600 nm, about 650 nm, about 700 nm, about 750 nm, about 800 nm, about 850 nm, about 900 nm, about 950 nm, or about 1000 nm.

In one or more embodiments, the film that is substantially free of hydrogen and deuterium comprises a dielectric material. As used herein, the term "dielectric" refers to an electrical insulator material that can be polarized by an applied electric field. In one or more embodiments, the dielectric material includes, but is not limited to, oxides, e.g., $SiO_2$, $Ta_2O_5$, $Al_2O_3$, nitrides, e.g., $Si_3N_4$, and barium strontium titanate (BST). In one or more embodiments, the dielectric material comprises silicon dioxide ($SiO_2$). In some embodiments, the film composition is non-stoichiometric relative to the ideal molecular formula. For example, in some embodiments, the dielectric material includes, but is not limited to, oxides (e.g., silicon oxide, tantalum oxide, aluminum oxide), nitrides (e.g., silicon nitride (SiN)), carbides (e.g. silicon carbide (SiC)), silicon carbo nitride (SiCN), oxycarbides (e.g. silicon oxycarbide (SiOC)), oxynitrocarbides (e.g. silicon oxycarbonitride (SiNCO)), and barium strontium titanate (BST).

In one or more embodiments, the term "high-K dielectric" refers to a material with a high dielectric constant (as compared to, e.g. silicon dioxide). In one or more embodiments, the film comprises a high-K dielectric material selected from one or more of $HfO_2$, $ZrO_2$, $VO_2$, $TiO_2$, $SnO_2$, $Al_2O_3$, or ZnO. In one or more specific embodiments, the film comprises a high-K dielectric material comprising or consisting essentially of $Al_2O_3$. As used herein, the term "consists essentially of" means that the composition of the bulk film comprises the elements specified in a sum totaling 95%, 98%, 99% or 99.5% of the total elemental composition by weight. In some embodiments, film is a high-K dielectric material comprising or consisting essentially of aluminum atoms.

FIG. 1 depicts a flow diagram of a method 10 of modifying a film in accordance with one or more embodiments of the present disclosure. With reference to FIG. 1, the method 10 optionally begins at operation 20 by positioning a substrate into a processing chamber.

The substrate may be any substrate known to one of skill in the art. In one or more embodiments, the substrate comprises one or more semiconductor material, e.g., silicon (Si), silicon oxide ($SiO_2$), germanium (Ge), silicon germanium (SiGe), gallium arsenide (GaAs), indium phosphorus (InP), indium gallium arsenide (InGaAs), indium aluminum arsenide (InAlAs), molybdenum disulfide ($MoS_2$), molybdenum diselenide ($MoSe_2$), tungsten disulfide ($WS_2$), tungsten diselenide ($WSe_2$), titanium nitride (TiN), tantalum nitride (TaN), tungsten (W), platinum (Pt), or iridium (Ir). In some embodiments, the substrate may comprise a spacer, a metal gate, a contact, or the like. Thus, in one or more embodiments, the substrate may comprises a semiconductor material including, but not limited to, copper (Cu), cobalt (Co), tungsten (W), titanium (Ti), molybdenum (Mo), nickel (Ni), ruthenium (Ru), silver (Ag), gold (Au), iridium (Ir), platinum (Pt), phosphorus (P), germanium (Ge), silicon (Si), aluminum (Al), zirconium (Zr), silicon carbonitride (SiCN), silicon oxycarbide (SiOC), silicon nitride (SiN), tungsten carbide (WC), tungsten oxide (WO), silicon oxycarbonitride (SiONC), or any semiconductor substrate material known to one of skill in the art.

At operation 30, the substrate with a film deposited thereon is modified to contain deuterium. In one or more embodiments, the film deposited on the substrate is substantially free of hydrogen and substantially free of deuterium. In one or more embodiments, modifying the film comprises exposing the film, which is substantially free of hydrogen and deuterium, to a plasma comprising a deuterium-containing precursor. In one or more embodiments, the deuterium-containing precursor may be pulsed or coflowed into the processing chamber with a flow gas or carrier gas. In other embodiments, the deuterium-containing precursor is pulsed into the processing chamber in the absence of a carrier gas. As used herein, the term "carrier gas" refers to a fluid (either gas or liquid) that can move a precursor molecule from one location to another. For example, a carrier gas can be a liquid that moves molecules from a solid precursor in an ampoule to an aerosolizer. In some embodiments, a carrier gas is an inert gas. In one or more embodiments, a carrier gas is one or more of argon (Ar), helium (He), xenon (Xe), or nitrogen ($N_2$).

In one or more embodiments, the deuterium-containing precursor comprises one or more of molecular deuterium ($D_2$), deuterated water ($D_2O$), DH (deuterium-hydrogen) or HDO (deuterium-hydrogen oxide).

In one or more embodiments, the plasma further comprises one or more of argon (Ar), helium (He), hydrogen ($H_2$), deuterium ($D_2$), nitrogen ($N_2$), oxygen ($O_2$), ammonia ($NH_3$), or nitrogen trifluoride ($NF_3$).

In one or more embodiments, the substrate has a temperature in the range of about 20° C. to 800° C., including about 150° C. to about 450° C. In one or more embodiments, the plasma has a pressure in the range of about 0.1 to about 500 millitorr, including about 1 to about 100 millitorr. In one or more embodiments, the plasma has a power in the range of about 500 to about 20,000 watts, including about 1000 to about 10,000 watts. In one or more embodiments, the plasma has a gas flow rate in the range of about 1 to about 5000 sccm, including about 50 to about 1000 sccm.

Figure 2:
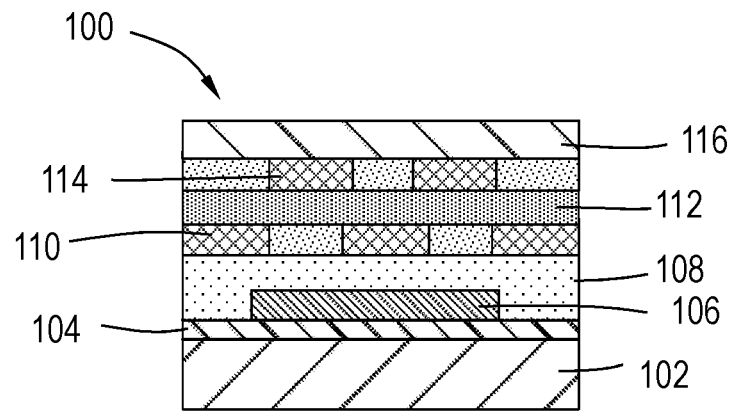
FIG. 2 shows a cross-section view of an electronic device in accordance with one or more embodiments.
Figure 3:
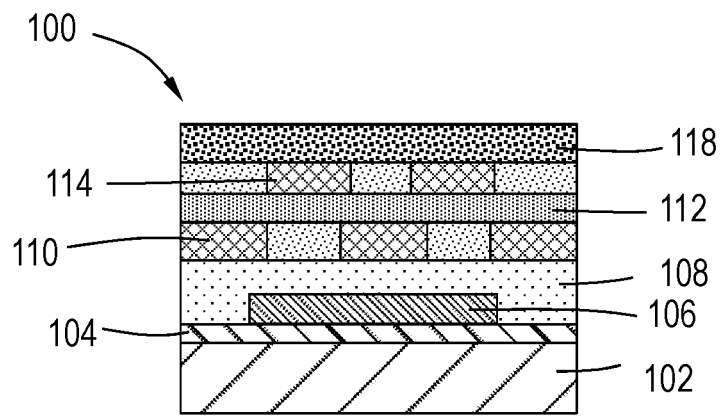
FIG. 3 shows a cross-section view of an electronic device in accordance with one or more embodiments.

With reference to FIGS. 2 and 3, in one or more embodiments, the film is part of CMOS device. In FIG. 2, the device 100 comprises a film stack on a semiconductor substrate 102. An oxide layer 104 is deposited or formed on the semiconductor substrate 102, and a first metal 106 is formed in a dielectric layer 108 on the oxide layer 104. A second metal layer 110 (X) is deposited on the dielectric layer 108. An interlayer dielectric 112 is deposited on the second metal layer 110, followed by deposition of a third metal layer 114 (X+1) on the interlayer dielectric. A post-metal dielectric layer 116 is deposited on the third metal layer 114. In one or more embodiments, the post-metal dielectric layer 116 is substantially free of hydrogen and substantially free of deuterium.

The interlayer dielectric (ILD) 112 can be deposited using one or more deposition techniques known to one of ordinary skill in the art of microelectronic device manufacturing. In one or more embodiments, interlayer dielectric (ILD) 112 is deposited using one of deposition techniques, such as, but not limited to, ALD, CVD, PVD, MBE, MOCVD, spin-on, or other insulating layer deposition techniques known to the skilled artisan. In one or more embodiments, interlayer dielectric (ILD) 112 comprises a low-K dielectric. In some embodiments, the low-K dielectric may be selected from one or more of silicon, silicon oxide, silicon nitride, silicon oxynitride, doped silicon, doped silicon oxide, doped silicon nitride, doped silicon oxynitride, or spin-on dielectrics. In one or more embodiments, interlayer dielectric (ILD) 112 comprises a silicon oxide.

Referring to FIG. 3, the post-metal dielectric layer 116 is modified to form a post-metal deuterium-containing dielectric layer 118. In one or more embodiments, the post-metal dielectric layer 116 is modified by exposure to a plasma comprising a deuterium-containing precursor. In one or more embodiments, the deuterium-containing precursor comprises one or more of molecular deuterium ($D_2$), deuterated water ($D_2O$), DH (deuterium-hydrogen) or HDO (deuterium-hydrogen oxide). In one or more embodiments, the plasma further comprises one or more of argon (Ar), helium (He), hydrogen ($H_2$), deuterium ($D_2$), nitrogen ($N_2$), oxygen ($O_2$), ammonia ($NH_3$), or nitrogen fluoride ($NF_3$). In one or more embodiments, the deuterium-containing precursor may be pulsed or coflowed into the processing chamber with a flow gas or carrier gas. In other embodiments, the deuterium-containing precursor is pulsed into the processing chamber in the absence of a carrier gas. In some embodiments, the carrier gas is an inert gas. In one or more embodiments, the carrier gas is one or more of argon (Ar), helium (He), xenon (Xe), or nitrogen ($N_2$).

As used herein, "chemical vapor deposition" refers to a process in which a substrate surface is exposed to precursors and/or co-reagents simultaneous or substantially simultaneously. As used herein, "substantially simultaneously" refers to either co-flow or where there is overlap for a majority of exposures of the precursors.

Plasma enhanced chemical vapor deposition (PECVD) is widely used to deposit thin films due to cost efficiency and film property versatility. In a PECVD process, for example, a hydrocarbon source, such as a gas-phase hydrocarbon or a vapor of a liquid-phase hydrocarbon that have been entrained in a carrier gas, is introduced into a PECVD chamber. A plasma-initiated gas is also introduced into the chamber. Plasma is then initiated in the chamber to create excited CH-radicals. The excited CH-radicals are chemically bound to the surface of a substrate positioned in the chamber, forming the desired film thereon. Embodiments described herein in reference to a PECVD process can be carried out using any suitable thin film deposition system. Any apparatus description described herein is illustrative and should not be construed or interpreted as limiting the scope of the embodiments described herein.

The method according to one or more embodiments, comprises a plasma modification process wherein a plasma comprising a deuterium-containing precursor is used to modified a film that is substantially free of hydrogen and deuterium form a film with deuterium. Without intending to be bound by theory, it is thought that the deuterium dopes the starting film. The plasma doping and modification process works by creating a high density of ionic radicals containing deuterium that transfer from plasma into a film on the substrate surface by thermal diffusion or by drift due to a force exerted by an electric field created through the film and substrate. After the plasma doping and modification process, the final film will have a concentration of ionic radicals containing deuterium and have a different total density of atoms.

Other embodiments are directed to optical devices which have a deuterium-containing film. Such optical devices could include a solar panel or an LED.

In further embodiments, in the manufacturing of solid state electronic devices, integrated process flows can be used to transfer deuterium from films containing deuterium into other film materials that are adjacent or in close proximity. For example in a complimentary metal-oxide-semiconductor (CMOS) or a dynamic random access memory (DRAM) solid state device, the pre-metal, inter-metal, or post-metal dielectric film layers may be deposited containing deuterium, and then a post thermal process or anneal may be executed to transfer the deuterium into embedded transistor and capacitor structures.

Figure 4:
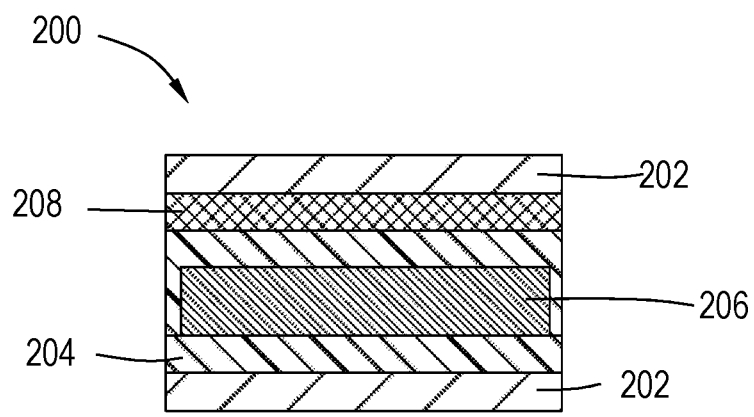
FIG. 4 shows a cross-section view of an electronic device in accordance with one or more embodiments.
Figure 5:
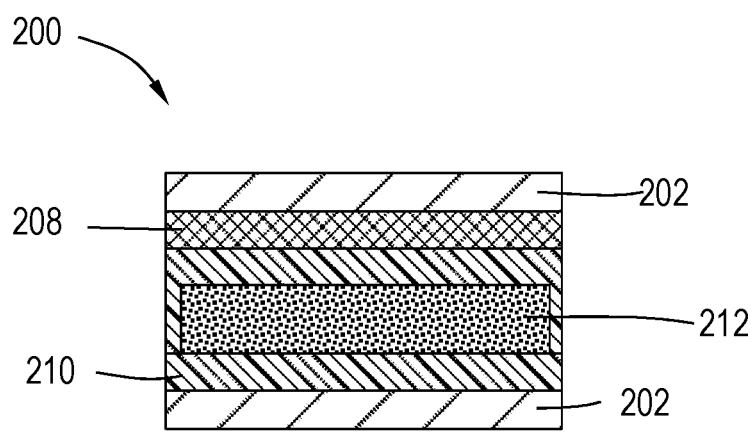
FIG. 5 shows a cross-section view of an electronic device in accordance with one or more embodiments.

Referring to FIGS. 4 and 5, in one or more embodiments, in optical solid state devices, such as, but not limited to, light emitting diodes (LED) or photovoltaic solar cells, dielectric thin film layers may be deposited or modified containing deuterium, and then a post thermal process or anneal may be executed to transfer the deuterium into the embedded active optical layers.

FIG. 4 illustrates a cross-section view of a solar cell device 200 prior to anneal. In one or more embodiments, a first dielectric layer 202 has a second dielectric layer 204 and an optical absorbing layer 206 former thereon. A third dielectric layer 208 is formed on the second dielectric 206, the third dielectric layer 208 containing deuterium. The first dielectric layer 202 is on a top surface of the deuterium-containing dielectric layer 208.

FIG. 5. Illustrates a cross-section view of a solar cell 200 after high temperature anneal in a temperature range of about 100° C. to about 700° C., including about 200° C. to about 450° C. As illustrated, the deuterium from the deuterium-containing third dielectric layer 208 transfers to the second dielectric layer 204 and the optical absorbing layer 206 forming a fourth dielectric layer 210 and a modified optional absorbing layer 212, wherein both the dielectric layer 210 and the optical absorbing layer 212 contain deuterium.

Figure 6:
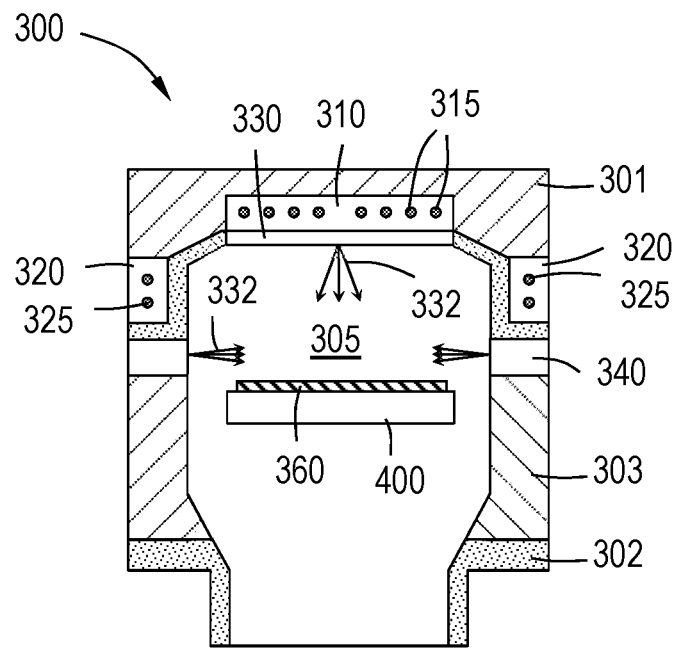
FIG. 6 shows a schematic of an apparatus in accordance with one or more embodiments.

With reference to FIG. 6, one or more embodiments of the disclosure are directed to processing chambers comprising a high density plasma (HDP) chemical vapor deposition (CVD) chamber 300. For example, in one or more embodiments, the processing chamber comprises the Ultima™ HDP-CVD chamber available from Applied Materials. The chamber 300 illustrated in FIG. 6 comprises a top 301, bottom 302 and sidewalls 303 enclosing an interior 305. The illustrated chamber includes a multi-zonal plasma coil comprising a top coil 310 and side coil 320 to enable tuning of the power delivered to the chamber 300 and enhance uniformity of the plasma formed in the chamber interior 305. The top coil 310 includes coiled antennae 315, and side coil 320 includes coiled antennae 325 to generate plasma in the interior 305. While not specifically illustrated, the skilled artisan will recognize the components and connections used to generate the plasma within the interior 305 of the chamber 300.

The chamber 300 has multi-zonal gas injectors. A top gas injector 330 is at the top 301 of the chamber 300 and a side gas injector 340 is at the sidewalls 303 of the chamber 300. Reactive gases 332 can be introduced to the interior 305 of the chamber through the top gas injector 330 or through the side gas injector 340 at the same time or separately. In some embodiments, the top gas injector 330 does not flow a reactive gas at the same time as the side gas injector 330.

In one or more embodiments, the processing chamber is a chemical vapor deposition chamber or a film modification chamber with inductive high density plasma sources (30 kHz to 30 GHz) designed with hardware capabilities to tune the deuterium concentration uniformity and hydrogen concentration uniformity in a deposited or modified film on a substrate. One embodiment enables tunability of the radial ion plasma density across the substrate surface by changing separate power setpoints to the top and side coiled antennae or by changing separate gas and precursor flows to the top and side gas injectors.

Figure 7:
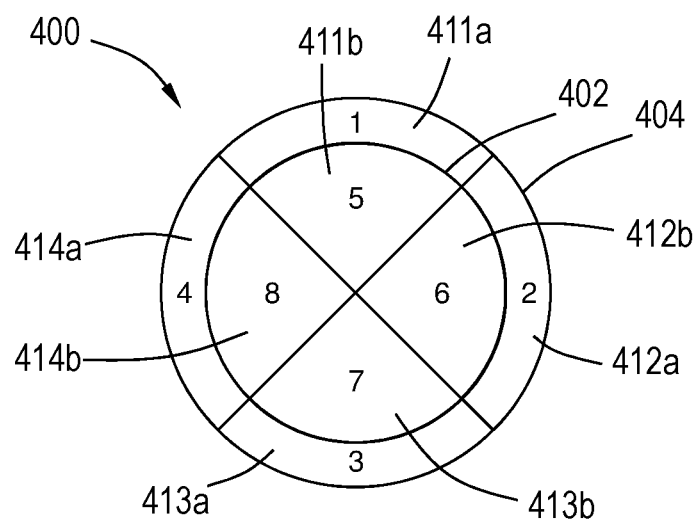
FIG. 7 shows a multi-zone susceptor in accordance with one or more embodiment of the disclosure.

The chamber 300 includes a susceptor 400 to support a substrate 360 during processing. FIG. 7 illustrates a multi-zone susceptor 400 in accordance with one or more embodiment of the disclosure. In one or more embodiments, the processing chamber comprises a multi-zone susceptor for tuning temperature and deposition uniformity and the deuterium and hydrogen concentration uniformity in a deposited or modified film on a substrate. The susceptor 400 illustrated has eight zones 411a, 411b, 412a, 412b, 413a, 413b, 414a, 414b separated into an inner ring 402 and an outer ring 404. Each of the outer zones 411a, 412a, 413a, 414a are angularly spaced around a center of the susceptor and each of the inner zones 411b, 412b, 413b, 414b are angularly spaced around the center of the susceptor and the inner zones.

In the illustrated embodiment, each of the inner ring 402 and outer ring 404 has four zones. In some embodiments, there are more or less than four zones. In some embodiments, each of the inner ring 402 and outer ring 404 independently comprises one, two, three, four, five, six, seven, eight, nine, ten, eleven or twelve zones.

The inner ring 402 and outer ring 404 are radially spaced rings, relative to the center of the susceptor. The term "radially spaced" means that the inner-most edges of the rings are located at a different radial distance from the susceptor center. In the illustrated embodiment, there are two radial zones made up by the inner ring 402 and outer ring 404. In some embodiments, there are one, three, four, five, six, seven or eight radial zones. Each of the radial zones can be independently controlled.

In some embodiments, as shown, the inner zones are aligned (angularly) with the outer zones. In some embodiments, the inner zones are offset from the outer zones.

In other embodiments, the processing chamber comprises independent multi-zone plasma coils with plasma power controls for tuning the plasma density uniformity inside the deposition chamber, and the deuterium and hydrogen concentration uniformity in a deposited or modified film on a substrate.

In further embodiments, the processing chamber comprises a multi-zone substrate susceptor with independent zonal temperature controls for tuning the substrate temperature uniformity, and the deuterium and hydrogen concentration uniformity in a deposited or modified film on a substrate.

In one or more embodiments, the substrate is positioned on a multi-zone susceptor, with each zone having independent temperature control. In one or more embodiments, the multi-zone susceptor has at least two zones. In some embodiments, the multi-zone susceptor comprises an inner zone and an outer zone. In other embodiments, the multi-zone susceptor has radially spaced zones. In yet further embodiments, the multi-zone susceptor comprises an inner zone and an outer zone, and each of the inner zone and outer zone comprise radially spaced zones.

In one or more embodiments, more deuterium is incorporated into the modified film in higher temperature zones than in lower temperature zones.

One or more embodiments are directed to an apparatus comprising a chamber body comprising a top and at least one side wall defining a plasma cavity; a first gas inlet centrally located in the top of the chamber body, the first gas inlet configured to deliver a flow of a plasma comprising a deuterium-containing precursor to the plasma cavity; a second gas inlet located in the at least one side wall of the chamber body, the second gas inlet configure to deliver a flow of the plasma comprising the deuterium-containing precursor to the plasma cavity; a top coil with antennae in the top of the chamber body; at least one side coil in the side of the chamber body; and a multi-zone susceptor, each zone having independent temperature control.

Other embodiments are directed to a method comprising modifying a solid state electronic device, the solid state electronic device comprising at least one buried layer containing deuterium, thermally annealing the solid state electronic device to transfer the deuterium into one or more adjacent layer, the adjacent layer substantially free of deuterium.

In other embodiments, films containing deuterium and silicon are deposited by chemical vapor deposition (CVD) or atomic layer deposition (ALD) using chemical precursors and inert gases. In one or more embodiments, the deposition method passivates dangling silicon bonds by introducing deuterium into a film. For example, in one or more embodiments, films including, but not limited to, $SiH_yD_z$, $SiO_{X1}H_yD_z$, $SiN_{X2}H_yD_z$, $SiC_{X3}H_yD_z$, $SiO_{X1}N_{X2}C_{X3}H_yD$, are deposited on a substrate surface. In one or more embodiments, deuterium-containing precursors comprise one of more of $D_2$, $D_2O$, $SiD_4$, $Si_2D_6$. In one or more embodiments, the deuterium-containing precursors may be combined, or co-flowed, with one or more silicon precursor selected from one or more of $SiH_4$, $Si_2H_6$, $SiCl_4$, $SiHCl_3$, $SiH_2Cl_2$, $SiHCl_3$, $Si_2Cl_6$, $SiF_4$, $SiBr_4$, TEOS, TDMAS, BTBAS, BDEAS, and the like. In one or more embodiments, the deuterium-containing precursors may be combined, or co-flowed, with one or more of oxygen ($O_2$), ozone ($O_3$), or water ($H_2O$). In one or more embodiments, the deuterium-containing precursors may be combined, or co-flowed, with one or more of nitrogen ($N_2$), or ammonia $NH_3$ to form a deuterium-containing nitride film. In one or more embodiments, the deuterium-containing precursors may be combined, or co-flowed, with one or more of methane ($CH_4$), or ethane ($C_2H_2$) to form deuterium-containing carbon films. In one or more embodiments, the deuterium-containing precursors may be combined, or co-flowed, with hydrogen ($H_2$). In one or more embodiments, the deuterium-containing precursors may be combined, or co-flowed, with one or more inert gas including, but not limited to, argon (Ar), or helium (He) to form a deuterium-containing film. In one or more embodiments, deposition processes may include thermal, plasma, and/or optical sources to activate precursors and to control chemical reaction rates.

"Atomic layer deposition" or "cyclical deposition" as used herein refers to the sequential exposure of two or more reactive precursors to deposit a layer of material on a substrate surface. The substrate, or portion of the substrate, is exposed separately to the two or more reactive precursors which are introduced into a reaction zone of a processing chamber. In a time-domain ALD process, exposure to each reactive compound is separated by a time delay to allow each compound to adhere and/or react on the substrate surface and then be purged from the processing chamber. These reactive compounds are said to be exposed to the substrate sequentially. In a spatial ALD process, different portions of the substrate surface, or material on the substrate surface, are exposed simultaneously to the two or more reactive compounds so that any given point on the substrate is substantially not exposed to more than one reactive compound simultaneously.

In one or more embodiments, the deuterium concentration in a deposited film on a substrate can be controlled and tuned by changing the deposition process parameters including precursor flow rates, substrate temperature, chamber pressure, and plasma power/density. For example, in one or more embodiments, a chemical vapor deposition process with an inductive high density plasma, the atomic concentration of deuterium in a $SiO_xH_yD_z$ film on a silicon substrate can be controlled by the flow rate of a deuterium-containing precursor.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" may encompass both an orientation of above and below. The device may be otherwise oriented (rotated 90 degrees or at other orientations) and the spatially relative descriptors used herein interpreted accordingly.

The use of the terms "a" and "an" and "the" and similar referents in the context of describing the materials and methods discussed herein (especially in the context of the following claims) are to be construed to cover both the singular and the plural, unless otherwise indicated herein or clearly contradicted by context. Recitation of ranges of values herein are merely intended to serve as a shorthand method of referring individually to each separate value falling within the range, unless otherwise indicated herein, and each separate value is incorporated into the specification as if it were individually recited herein. All methods described herein can be performed in any suitable order unless otherwise indicated herein or otherwise clearly contradicted by context. The use of any and all examples, or exemplary language (e.g., "such as") provided herein, is intended merely to better illuminate the materials and methods and does not pose a limitation on the scope unless otherwise claimed. No language in the specification should be construed as indicating any non-claimed element as essential to the practice of the disclosed materials and methods.

Reference throughout this specification to "one embodiment," "certain embodiments," "one or more embodiments" or "an embodiment" means that a particular feature, structure, material, or characteristic described in connection with the embodiment is included in at least one embodiment of the disclosure. Thus, the appearances of the phrases such as "in one or more embodiments," "in certain embodiments," "in one embodiment" or "in an embodiment" in various places throughout this specification are not necessarily referring to the same embodiment of the disclosure. In one or more embodiments, the particular features, structures, materials, or characteristics are combined in any suitable manner.

Although the disclosure herein has been described with reference to particular embodiments, it is to be understood that these embodiments are merely illustrative of the principles and applications of the present disclosure. It will be apparent to those skilled in the art that various modifications and variations can be made to the method and apparatus of the present disclosure without departing from the spirit and scope of the disclosure. Thus, it is intended that the present disclosure include modifications and variations that are within the scope of the appended claims and their equivalents.

What is claimed is:

1. A method of modifying a film, the method comprising modifying a first dielectric film deposited on a substrate by exposing the first dielectric film to a plasma comprising a deuterium-containing precursor to form a modified dielectric film containing deuterium, wherein the first dielectric film is substantially free of hydrogen and deuterium, wherein the plasma has a pressure in the range of about 0.1 to about 500 millitorr.

2. The method of claim 1, wherein the deuterium-containing precursor comprises one or more of $D_2$, $D_2O$, DH (deuterium-hydrogen) or HDO (deuterium-hydrogen oxide).

3. The method of claim 1, wherein the plasma further comprise comprises one or more of argon (Ar), helium (He), hydrogen ($H_2$), nitrogen ($N_2$), oxygen ($O_2$), ammonia ($NH_3$), or nitrogen fluoride ($NF_3$).

4. The method of claim 1, wherein the first dielectric film is maintained at a temperature in the range of about 20° C. to about 800° C.

5. The method of claim 1, wherein the plasma has a power in the range of about 500 to about 20,000 watts.

6. The method of claim 1, wherein the plasma has a gas flow rate in the range of about 1 to about 5000 sccm.

7. The method of claim 1, wherein the first dielectric film is part of a CMOS device.

8. The method of claim 1, wherein the first dielectric film is part of an optical solid state device.

9. The method of claim 1, wherein the substrate is positioned on a multi-zone susceptor, with each zone having independent temperature control.

10. The method of claim 9, wherein the multi-zone susceptor has at least two zones.

11. The method of claim 10, wherein the multi-zone susceptor comprises an inner zone and an outer zone.

12. The method of claim 10, wherein the multi-zone susceptor has radially spaced zones.

13. The method of claim 10, wherein the multi-zone susceptor comprises an inner zone and an outer zone, and each of the inner zone and outer zone comprise radially spaced zones.

14. The method claim 9, wherein more deuterium is incorporated into the first dielectric film in higher temperature zones than in lower temperature zones.

15. A method of modifying a film, the method comprising exposing a substrate with a first dielectric film substantially free of hydrogen and deuterium deposited thereon to a plasma comprising a deuterium-containing precursor to form a modified deuterium-containing dielectric film on the substrate, wherein the plasma has a power in the range of about 500 to about 20,000 watts.

16. The method of claim 15, wherein the deuterium-containing precursor comprises one or more of $D_2$, $D_2O$, DH (deuterium-hydrogen) or HDO (deuterium-hydrogen oxide).

17. The method of claim 15, wherein the plasma further comprise comprises one or more of argon (Ar), helium (He), hydrogen ($H_2$), nitrogen ($N_2$), oxygen ($O_2$), ammonia ($NH_3$), or nitrogen fluoride ($NF_3$).

* * * * *